United States Patent
Yamauchi et al.

(10) Patent No.: US 8,595,920 B2
(45) Date of Patent: Dec. 3, 2013

(54) COMPONENT MOUNTING DEVICE IN WHICH A DEVICE TYPE CHANGING OPERATION IS PERFORMED IN ONE MOUNTING LANE WITHOUT STOPPING ANOTHER MOUNTING LANE

(75) Inventors: Satoshi Yamauchi, Yamanashi (JP); Takeyuki Kawase, Yamanashi (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/578,382

(22) PCT Filed: Nov. 25, 2011

(86) PCT No.: PCT/JP2011/006579
§ 371 (c)(1),
(2), (4) Date: Aug. 10, 2012

(87) PCT Pub. No.: WO2012/081172
PCT Pub. Date: Jun. 21, 2012

(65) Prior Publication Data
US 2012/0311854 A1    Dec. 13, 2012

(30) Foreign Application Priority Data
Dec. 17, 2010   (JP) ................................. 2010-281601

(51) Int. Cl.
*H05K 13/04*   (2006.01)

(52) U.S. Cl.
USPC ................... 29/729; 29/739; 29/740; 29/834; 700/95

(58) Field of Classification Search
USPC ................... 29/740–743, 834, 705, 719–721; 700/160, 102; 414/752.1, 415; 399/291, 256, 266; 198/709, 764, 782
See application file for complete search history.

(56) References Cited

U.S. PATENT DOCUMENTS

| | | | |
|---|---|---|---|
| 5,313,401 A * | 5/1994 | Kasai et al. | 700/160 |
| 7,021,357 B2 * | 4/2006 | Katano et al. | 156/556 |
| 8,136,219 B2 * | 3/2012 | Endo et al. | 29/593 |
| 8,196,295 B2 * | 6/2012 | Imafuku et al. | 29/834 |
| 2003/0131468 A1 * | 7/2003 | Yasuda | 29/739 |
| 2011/0179638 A1 | 7/2011 | Nagao | |
| 2012/0311854 A1 * | 12/2012 | Yamauchi et al. | 29/729 |
| 2012/0314395 A1 * | 12/2012 | Yamauchi et al. | 361/837 |

FOREIGN PATENT DOCUMENTS

| | | |
|---|---|---|
| JP | 07-202486 A | 8/1995 |
| JP | 2002-076698 A | 3/2002 |
| JP | 2003-133800 A | 5/2003 |
| JP | 2009-272562 A | 11/2009 |
| WO | 2010/038437 A1 | 4/2010 |

OTHER PUBLICATIONS

International Search Report for PCT/JP2011/006579 dated Jan. 10, 2012.

* cited by examiner

*Primary Examiner* — Minh Trinh
(74) *Attorney, Agent, or Firm* — Pearne & Gordon LLP

(57) ABSTRACT

In an operation performing step which performs operations associated with the device type changing by operating operation switches such as a "file operation" (35e) which are displayed by selecting a "device type changing" (33c) which is displayed in an operation screen (30) on an operation panel, when a non-object mounting lane except an operation object performs operation actions, the inputting of the operations with the operation switches is permitted and the inputting of the operations with a lane specifying switch (36) is prohibited so that a second mounting lane (L2) which is producing will not become an object of the inputting of operations.

1 Claim, 9 Drawing Sheets

COMPONENT MOUNTING DEVICE IN WHICH A DEVICE TYPE CHANGING OPERATION IS PERFORMED IN ONE MOUNTING LANE WITHOUT STOPPING ANOTHER MOUNTING LANE

TECHNICAL FIELD

The present invention relates to a component mounting device which mounts electronic components on substrates and a device type changing method in the component mounting device in which operation processes when the type of substrates as mounting objects is changed are performed.

BACKGROUND ART

An electronic component mounting system which manufactures a mounted substrate by mounting electronic components on the substrate is formed by combining a plurality of component mounting devices which mount the electronic components on the substrate on which paste for solder bonding was printed. In recent years, in the electronic industry, with the development of the diversification of production patterns, the production pattern in which multiple types of products are manufactured in a limited quantity is also increasingly applied in the component mounting field. Therefore, in the component mounting system, the frequency of device type changing operations with the change of the type of the substrate which is a production object increases. Various schemes are proposed to effectively perform device type changing operations for the purpose of improving the productivity in the production field of the component mounting (for example, refer to a patent document 1). In the prior art shown in this patent document, component type information of current production lot and the next production lot are checked, and common component types and different component types in the two production lots are identified and displayed based on the check result. Thereby, it becomes possible to prepare the component types necessary for the next production lot during the current production.

RELATED ART DOCUMENT

Patent Document

Patent document 1: Japan Patent Publication No. 7-202486

SUMMARY OF THE INVENTION

Problems to be Solved by the Invention

It is known that a component mounting device includes two independent mounting lanes both of which include a substrate conveying mechanism that conveys substrates and a component mounting mechanism that mounts components on the substrates. With such a structure, component mounting operations can be performed concurrently on two different types of substrates by the two mounting lanes. However, because the end timing of one production lot varies for each of the mounting lanes in the component mounting device of the above structure, it is necessary to perform the device type changing operation for each of the mounting lanes with the change of the substrate type. In view of improving the operating rate of the device, it is desirable to perform the device type changing operation only for the mounting lane whose production lot is finished without stopping the operation of the working mounting lane.

However, the device type changing operation is accompanied with manual operations performed by an operator such as the replacement of a component supply device such as a tape feeder which supplies components to the component mounting mechanism and the replacement of an adsorbing nozzle which is used in the component mounting mechanism. Thus, in order to make it possible to perform the device type changing operation for one mounting lane while the other mounting lane is in a working condition, complicated operations are required so that the safety of the operator will not be impaired. Therefore, there is a demand for a component mounting device and a device type changing method which make it possible to easily perform the device type changing operation with the change of the substrate type in the component mounting device which includes a plurality of mounting lanes, without stopping the operation of the other mounting lane and without impairing the safety of the operator.

The present invention is intended to provide a component mounting device and a device type changing method in the component mounting device which make it possible to easily perform a device type changing operation with the change of substrate type in a component mounting device which includes a plurality of mounting lanes, without stopping the operation of the other mounting lane and without impairing the safety of an operator.

Means for Solving the Problems

A component mounting device of this invention, comprises a first substrate conveying mechanism and a second substrate conveying mechanism which convey substrates delivered from upstream devices in substrate conveying directions, and have substrate holding parts which position and hold the substrates, respectively, a first component supply part and a second component supply part which are provided respectively beside the first substrate conveying mechanism and the second substrate conveying mechanism and supply components to be mounted on the substrates, a first component mounting mechanism and a second component mounting mechanism which take out the components from the first component supply part and the second component supply part which are provided respectively in accordance with the first substrate conveying mechanism and the second substrate conveying mechanism and mount on the substrates which are held by the substrate holding part of the first substrate conveying mechanism and the substrate holding part of the second substrate conveying mechanism, respectively, an operation panel which makes it possible to input operations for both of a first mounting lane which comprises the first substrate conveying mechanism, the first component supply part and the first component mounting mechanism and a second mounting lane which comprises the second substrate conveying mechanism, the second component supply part and the second component mounting mechanism, operation switches which are provided on the operation panel and comprise a lane specifying switch which specifies a mounting lane which is the object of the inputting of operations, a stop switch for stopping the device operations of the specified mounting lane, and a device type changing switch for performing a replacing operation with the change of the substrate type of the substrates as mounting objects, and an input control processing part which controls the inputting of operations performed through the operation switches, wherein after an operator specifies an object mounting lane as an operation object with the lane specifying switch and stops the operation actions of the specified object mounting lane by operating the operation panel, when the device type changing switch is operated, the input control processing part performs operation processes for the device type changing which make the operation switches for performing operations associated with the device type changing for the object mounting lane to be in an operable state, and when a non-object mounting lane except the object mounting lane performs component mounting operations, the input control processing part performs input control processes to permit the inputting of the operations of the operation switches and prohibit the inputting of the operations of the lane specifying switch.

A device type changing method in a component mounting device of this invention, comprises a first substrate conveying mechanism and a second substrate conveying mechanism which convey substrates delivered from upstream devices in a substrate conveying direction, and have substrate holding parts which position and hold the substrates, respectively, a first component supply part and a second component supply part which are provided respectively beside the first substrate conveying mechanism and the second substrate conveying mechanism and supply components to be mounted on the substrates, a first component mounting mechanism and a second component mounting mechanism which take out the components from the first component supply part and the second component supply part which are provided respectively in accordance with the first substrate conveying mechanism and the second substrate conveying mechanism and mount on the substrates which are held by the substrate holding part of the first substrate conveying mechanism and the substrate holding part of the second substrate conveying mechanism, respectively, an operation panel which makes it possible to input operations for both of a first mounting lane which comprises the first substrate conveying mechanism, the first component supply part and the first component mounting mechanism and a second mounting lane which comprises the second substrate conveying mechanism, the second component supply part and the second component mounting mechanism, operation switches which are provided on the operation panel and comprise a lane specifying switch which specifies a mounting lane which is the object of the inputting of operations, a stop switch for stopping the device operations of the specified mounting lane, and a device type changing switch for performing a replacing operation with the change of the substrate type of the substrates as mounting objects, and an input control processing part which controls the inputting of operations performed through the operation switches, the device type changing method performing the device type changing of the substrates and comprising a mounting lane specifying step in which an operator specifies an object mounting lane to be an operation object with the lane specifying switch by operating the control panel, a device type changing operation processing step in which after the operation actions of the specified object mounting lane are stopped, the device type changing switch is operated so that operation switches for performing operations associated with the device type changing for the object mounting lane becomes to be in an operable state, and an operation performing step in which the operations associated with the device type changing are performed by operating the operation switches, wherein when a non-object mounting lane except the object mounting lane performs operation actions, the inputting of the operations with the operation switches is permitted and the inputting of the operations of the lane specifying switch is prohibited.

Effects of the Invention

According to the present invention, in the operation performing step that performs operations associated with the device type changing by operating the operation switches, when a non-object mounting lane except the object mounting lane which becomes the operation object performs operation actions, the inputting of operations with the operation switches for performing operations associated with the device type changing is permitted, and the inputting of operations with the lane specifying switch which specifies a mounting lane that becomes an object of the inputting of operations is prohibited. Thereby, the device type changing operation with the change of the substrate type can be easily performed, without stopping the operation of the other mounting lane and without impairing the safety of the operator.

EMBODIMENTS OF THE INVENTION

Figure 1:
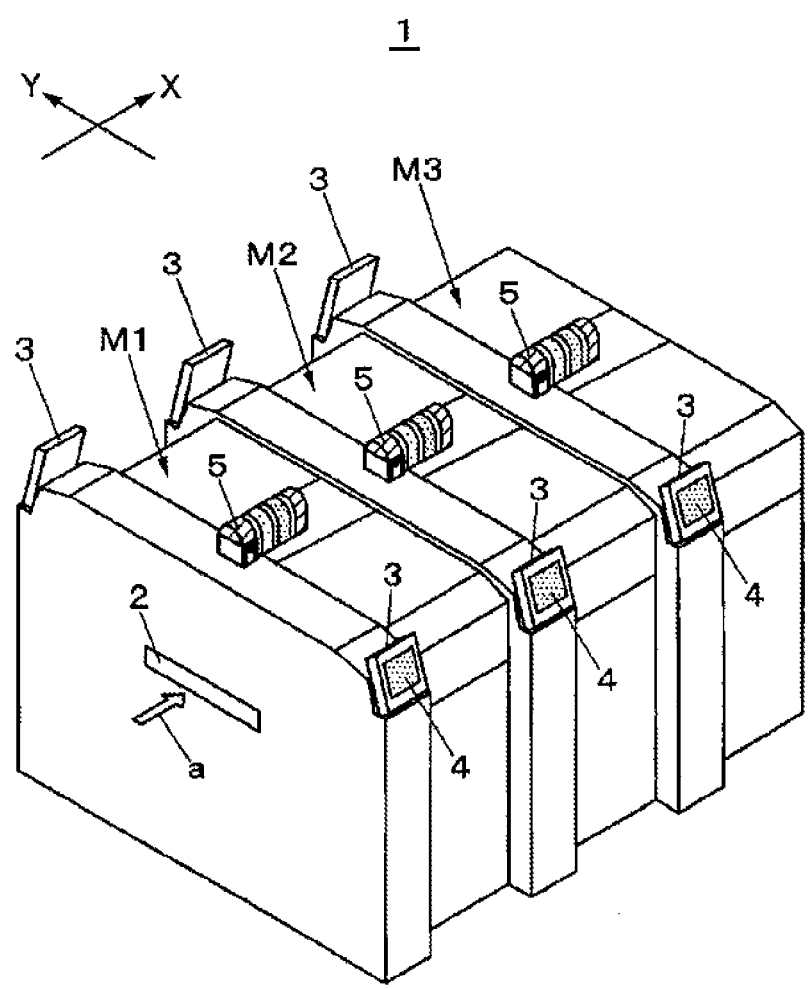
FIG. 1 is a perspective view which shows the structure of a component mounting system of one embodiment of the present invention.

Next, an embodiment of the invention is described with reference to the figures. First, the structure of a component mounting system 1 is described with reference to FIGS. 1 and 2. The component mounting system 1 is formed by connecting a plurality of (here, three) component mounting device M1, M2 and M3 in series, and has a function of manufacturing mounted substrates by mounting components on substrates. As shown in FIG. 2, the component mounting system 1 includes a first mounting lane L1 and a second mounting lane L2 each of which can be operated independently. Substrates, on which electronic components are to be mounted, are supplied from upstream (arrow a), passed to substrate conveying mechanisms (refer to a front substrate conveying mechanism 11A and a back substrate conveying mechanism 11B shown in FIG. 2) through a conveying opening 2 provided at to the component mounting device M1 positioned in the uppermost stream, and conveyed sequentially in an X direction (substrate conveying direction) in the component mounting system 1. The imported substrates become the objects of component mounting operations of the devices, and the substrates after the component mounting operations are further exported to downstream devices.

Operation substrates 3 corresponding to the first mounting lane L1 and the second mounting lane L2 respectively, are provided respectively on device side surfaces of the component mounting devices M1 to M3. Each of the operation substrates 3 includes an operation panel 4 such as a liquid crystal panel, and an operation screen 30 (refer to FIG. 4) for the purpose of inputting operations to make the individual devices to be operated is displayed on the operation panel 4. Signal towers 5 are provided on the top surfaces of the component mounting devices M1 to M3, and the signal towers 5 display operation states of the individual devices with signal lamps of different colors.

The structure of the component mounting devices M1 to M3 is described. Because the component mounting devices M1 to M3 have the same structure, only the component mounting device M1 is given symbols and described herein, and the descriptions of the component mounting devices M2 and M3 are omitted. In FIG. 2, a front substrate conveying mechanism 11A (first substrate conveying mechanism) and a back substrate conveying mechanism 11B (second substrate conveying mechanism) are provided at the center of a base 10 in the X direction (substrate conveying direction). Herein, the bottom side in the figure is defined as a front side, and the top side in the figure is defined as a back side. The front substrate conveying mechanism 11A and the back substrate conveying mechanism 11B convey substrates 6, which are delivered from upstream devices respectively to the X direction downstream. The front substrate conveying mechanism 11A and the back substrate conveying mechanism 11B have a substrate holding part 7, respectively, and the substrates 6 which are conveyed from upstream are positioned and held at mounting operation positions of component mounting mechanisms described below by the substrate holding parts 7.

A front component supply part 12A (first component supply part) and a back component supply part 12B (second component supply part), which supply components that are to be mounted on the substrates 6, are provided outside the first substrate conveying mechanism 11A and the second substrate conveying mechanism 11B, respectively. A plurality of tape feeders 13 are provided in parallel in the front component supply part 12A and the back component supply part 12B, respectively. The tape feeders 13 supply the components to component drawn out positions of the component mounting mechanisms by pitch sending carrier tapes which accommodate and hold the components.

A Y axis movable table 14 which includes a linear driving mechanism is disposed horizontally in the Y direction at one end of the base 10 in the X direction, and two X axis movable tables which also include a linear driving mechanism, are coupled to the Y axis movable table 14. A front mounting head 17A (first mounting head) and a back mounting head 17B (second mounting head) are installed to the X axis movable tables 15A and 15B respectively, and are movable in the X direction. The Y axis movable table 14 and the X axis movable table 15A, and the Y axis movable table 14 and the X axis movable table 15B form a front head moving mechanism 16A and a back to head moving mechanism 16B, respectively. When the front head moving mechanism 16A and the back head moving mechanism 16B are driven, the front mounting head 17A and the back mounting head 17B move in the X direction and the Y direction horizontally, take out components from the tape feeders 13 of the front component supply part 12A and the back component supply part 12B, respectively, and mount the components on the substrates 6 positioned and held at the substrate holding parts 7 of the front substrate conveying mechanism 11A and the back substrate conveying mechanism 11B, respectively (refer to bold line arrows which link the front mounting head 17A and the front substrate conveying mechanism 11A, and the back mounting head 17B and the back substrate conveying mechanism 11B, respectively).

That is, a combination of the front head moving mechanism 16A and the front mounting head 17A and a combination of the back head moving mechanism 16B and the back mounting head 17B are provided respectively in accordance with the front substrate conveying mechanism 11A (the first substrate conveying mechanism) and the back substrate conveying mechanism 11B (the second substrate conveying mechanism). These head moving mechanisms and mounting heads form a first component mounting mechanism and a second component mounting mechanism which take out components from the front component supply part 12A (the first component supply part) and the back component supply part 12B (the second part supply), and mount the components on the substrates 6 held at the substrate holding parts 7 of the front substrate conveying mechanism 11A and the back substrate conveying mechanism 11B, respectively.

Substrate recognition cameras 8 which move integrally with the front to mounting head 17A and the back mounting head 17B, respectively, are provided at the bottom sides of the X axis movable table 15A and the X axis movable table 15B. The substrate recognition cameras 8 respectively image the substrates 6 when the front mounting head 17A and the back mounting head 17B move over the substrates 6 on the front substrate conveying mechanism 11A and the back substrate conveying mechanism 11B, respectively. Further, component recognition cameras 9 are disposed between the front component supply part 12A and the front substrate conveying mechanism 11A, and between the back component supply part 12B and the back substrate conveying mechanism 11B, respectively. When the front mounting head 17A and the back mounting head 17B which take out the components from the front component supply part 12A and the back component supply part 12B move over the component recognition cameras 9, the component recognition cameras 9 image the components which are held by the front mounting head 17A and the back mounting head 17B.

A component mounting position in the substrate 6 is recognized with a recognition process on an imaging result of the substrate recognition camera 8, and the recognition and the positional deviation detection of a component which is held by the front mounting head 17A or the back mounting head 17B are performed with a recognition process on an imaging result of the component recognition camera 9. An on-substrate position is revised by taking these recognition results into consideration in component mounting actions of the first component mounting mechanism or the second component mounting mechanism.

In the component mounting system 1, the front substrate conveying mechanisms 11A, the front component supply parts 12A, the front head moving mechanisms 16A and the front mounting heads 17A of the component mounting devices M1 to M3 form a first mounting lane L1 which performs component mounting operations on the substrates 6 which are conveyed along a series of substrate conveying lane which joins the front substrate conveying mechanisms 11A. Likewise, the back substrate conveying mechanisms 11B, the back component supply parts 12B, the back head moving mechanisms 16B and the back mounting heads 17B of the component mounting devices M1 to M3 form a second mounting lane L2 which performs component mounting operations on the substrates 6 which are conveyed along a series of substrate conveying lane which joins the back substrate conveying mechanisms 11B.

Figure 2:
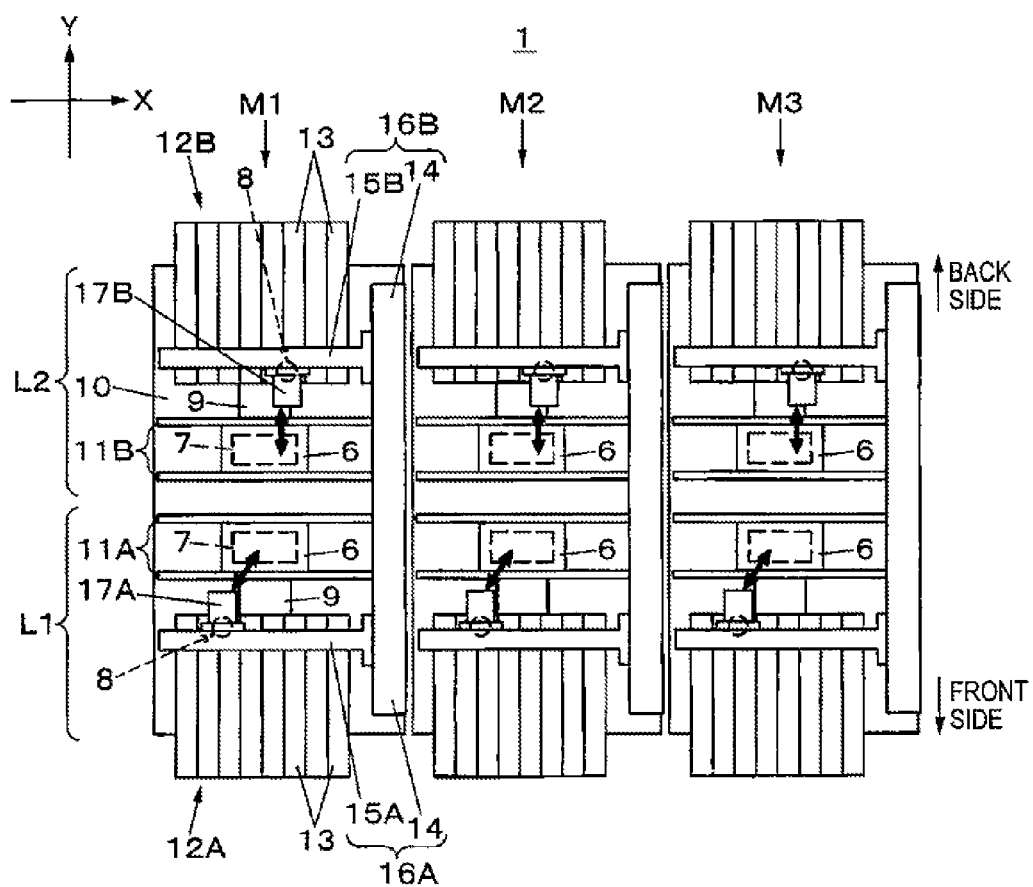
FIG. 2 is a top view of the component mounting system of the embodiment of the present invention.

As shown in FIG. 1, the operation substrates 3 which are provided at the individual component mounting devices M1 to M3 are arranged to be provided at the side surfaces corresponding to the first mounting lane L1 and the second mounting lane L2, respectively. In the component mounting system 1 shown in the present embodiment, these two operation substrates 3 make it possible to input operations on both of the first mounting lane L1 and the second mounting lane L2 in the device. That is, even when it is necessary to input operations on the second mounting lane L2 which is located at the back side, an operator which performs operations at the front side of the device can input the operations through the current operation substrate 3 at the front side without changing his/her own operation position.

Likewise, when an operator performs operations at the back side, if it is necessary to input operations on the first mounting lane L1 which is located at the front side, it is possible to input the necessary operations through the current operation substrate 3 at the back side. In this embodiment, an example is shown in which two operation substrates 3 are provided for each of the devices with an arrangement corresponding to the first mounting lane L1 and the second mounting lane L2 respectively, but one operation substrate 3 whose direction can be changed to the front and back sides of one device may be included.

Figure 3:
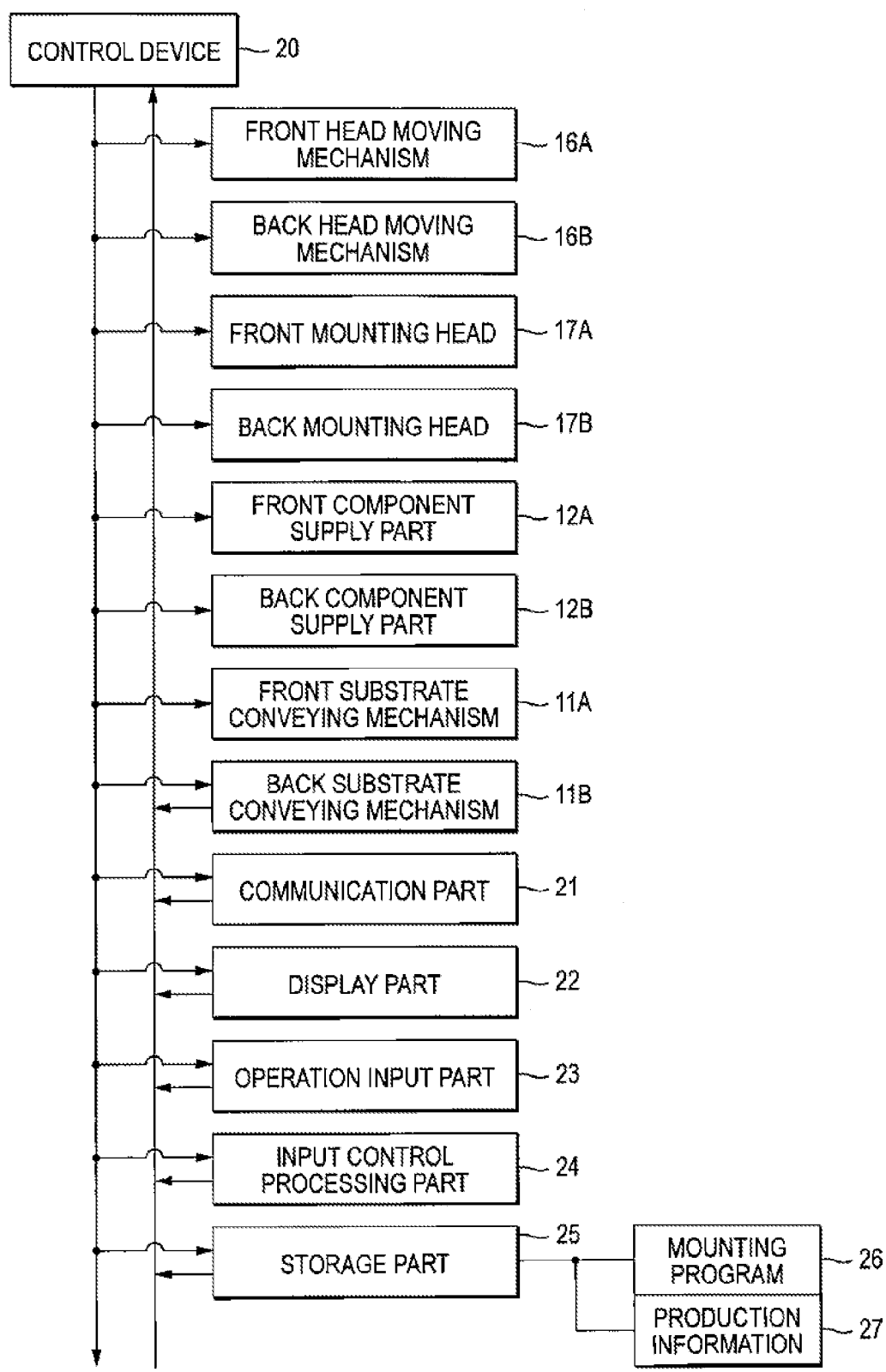
FIG. 3 is a block diagram which shows the structure of a control system of the component mounting device of the embodiment of the present invention.

Next, the structure of a control system is described with reference to FIG. 3. In FIG. 3, a control device 20 controls the following components which form each of the component mounting devices M1 to M3. When the control device 20 controls the front head moving mechanism 16A, the front mounting head 17A and the front component supply part 12A, the first mounting lane L1 is an object mounting lane and component mounting operations are performed on substrates 6 imported to the front substrate conveying mechanism 11A. When the control device 20 controls the back head moving mechanism 16B, the back mounting head 17B and the back component supply part 12B, the second mounting lane L2 is an object mounting lane and component mounting operations are performed on substrates 6 imported to the back substrate conveying mechanism 11B.

At this time, when the control device 20 controls the first mounting lane L1 and the second mounting lane L2 individually, component mounting operations can be performed independently in the first mounting lane L1 and the second mounting lane L2. That is, even when one mounting lane is stopped due to a device type changing operation with the change of the substrate type, component mounting operations can be continuously performed by the other mounting lane.

A communication part 21 is connected to other devices through an LAN system (not shown in the figures) and transmit and receives control signals or data to and from the other devices. A display part 22 performs operations to make screens such as an operation screen or various information screens to be displayed on the operation panel 4 which is provided on the operation substrate 3. An operation input part 23 is an input means such as touch panel switches which are provided on the operation panel 4, and is operated when operations, production data and the like for device operations are input. An input control processing part 24 performs processes to control the inputting of operations performed through operation switches which form the operation input part 23. The detailed functions of the input control processing part 24 will be described below in conjunction with the layout and functions of the operation screen 30 shown in FIGS. 4 to 7. A storage part 25 stores a mounting program 26 and production information 27 which are necessary for substrate conveying actions and component mounting actions to be performed.

Figure 4:
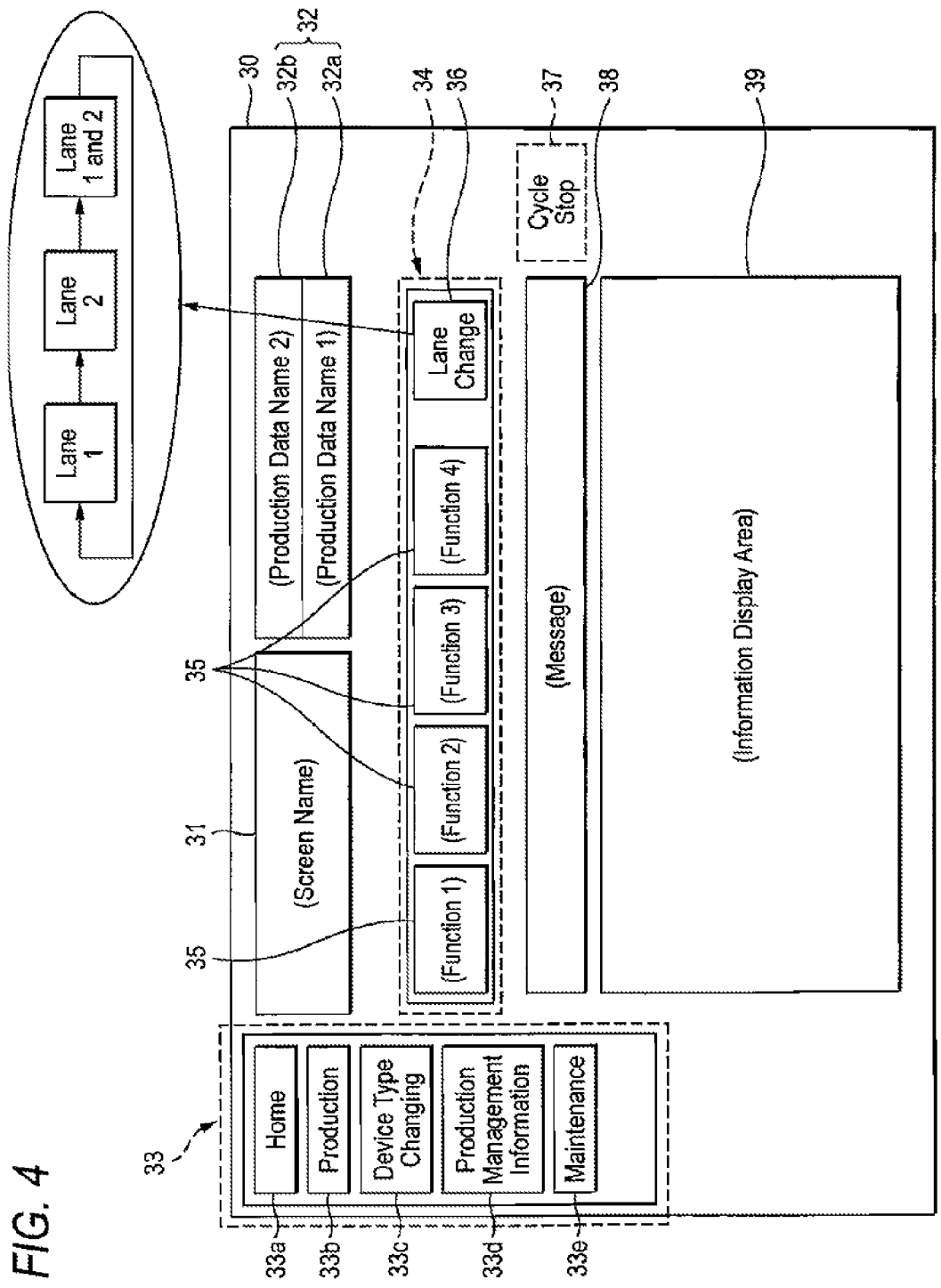
FIG. 4 is an illustrative figure of a layout and functions of an operation screen in the component mounting device of the embodiment of the present invention.

Next, a layout and detailed functions of the operation screen 30 which is displayed on the operation panel 4 are described with reference to FIG. 4. As shown in FIG. 4, the operation screen 30 includes a screen name 31 which indicates the subject matter displayed as information, production data 32 which indicate the substrate types of the production, a first operation switch frame 33, a second operation switch frame 34 and a message frame 38 in which touch panel switches which are set in the screen are displayed hierarchically, and an information display area 39.

The subject matter of the detailed information displayed on the information display area 39 is displayed in the screen name 31 according to the input operations of the individual operation switches displayed in the first operation switch frame 33 and the second operation switch frame 34. A "production data name 1" 32a and a "production data name 2" 32b, which respectively indicate the substrate types of the production in the first mounting lane L1 and the second mounting lane L2, are displayed in the production data 32. The subject matters of the information which should be displayed in the operation screen 30 are classified into a plurality of divisions, and first level operation switches are displayed in the first operation switch frame 33. These first level operation switches include a "home" 33a, a "production" 33b, a "device type changing" 33c, a "production management information" 33d, and a "maintenance" 33e.

By operating the "home" 33a, an initial screen is displayed on the operation screen 30. By operating the "production" 33b, information related to performing production operations of mounting components on substrates (that is, component mounting operations) are displayed. The "device type changing" 33c is a device type changing switch, and by operating the "device type changing" 33c, information related to performing device type changing operations which change the substrate type of the production are displayed. By operating the "production management information" 33d and the "maintenance" 33e, respectively, information related to production management such as a production schedule or a production records of the device, and information related to device maintenance such as a history of maintenance works or a maintenance work schedule of the device are displayed, respectively.

A plurality of function switches 35 (functions 1 to 4) and a lane specifying switch 36 are displayed in the second operation switch frame 34. Operation switches of operation subject matters, which have functions respectively corresponding to the "home" 33a, the "production" 33b, the "device type changing" 33c, the "production management information" 33d and the "maintenance" 33e which are operated by being selected in the first operation switch frame 33, are displayed as the function switches 35. The lane specifying switch 36 is an operation switch for specifying a mounting lane which is the object of the input operations with the operation screen 30. By operating the lane specifying switch 36, the object of the input operations can be changed among only the first mounting lane L1, only the second mounting lane L2 and both the first mounting lane L1 and the second mounting lane L2.

Similarly, a stop switch 37 is a touch panel switch type operation switch. By operating the stop switch 37, operation actions in the mounting lane is stopped when one cycle of component mounting actions which are performing is completed. Messages for informing, instructing or warning an operator are displayed in the message frame 38 as needed. Display contents which are specified by sequentially selecting the operation switches displayed in the first operation switch frame 33 and the second operation switch frame 34, that is, detailed information such as text information, a chart or a graph that display the subject matter shown in the screen name 31 are displayed in the information display area 39.

That is, in the operation screen 30 which is displayed on the operation panel 4 shown in the present embodiment, the lane specifying switch 36 which specifies a mounting lane which is the object of the input operations, the stop switch 37 for stopping the device operations of the specified mounting lane, and the plurality of operation switches including the "device type changing" 33c which is a device type changing switch for performing a replacing operation with the change of the substrate type of the substrates as mounting objects, are set in a way of touch panel switches. In the above embodiment, touch panel switches, which are set in the operation screen 30, are used as these operation switches, but the operation switches are not limited to touch panel switches, and mechanical switches such as a push button or a snap switch may be used. In this case, a screen for specifying functions and arrangement of these mechanical switches is displayed in the operation screen 30.

Figure 5:
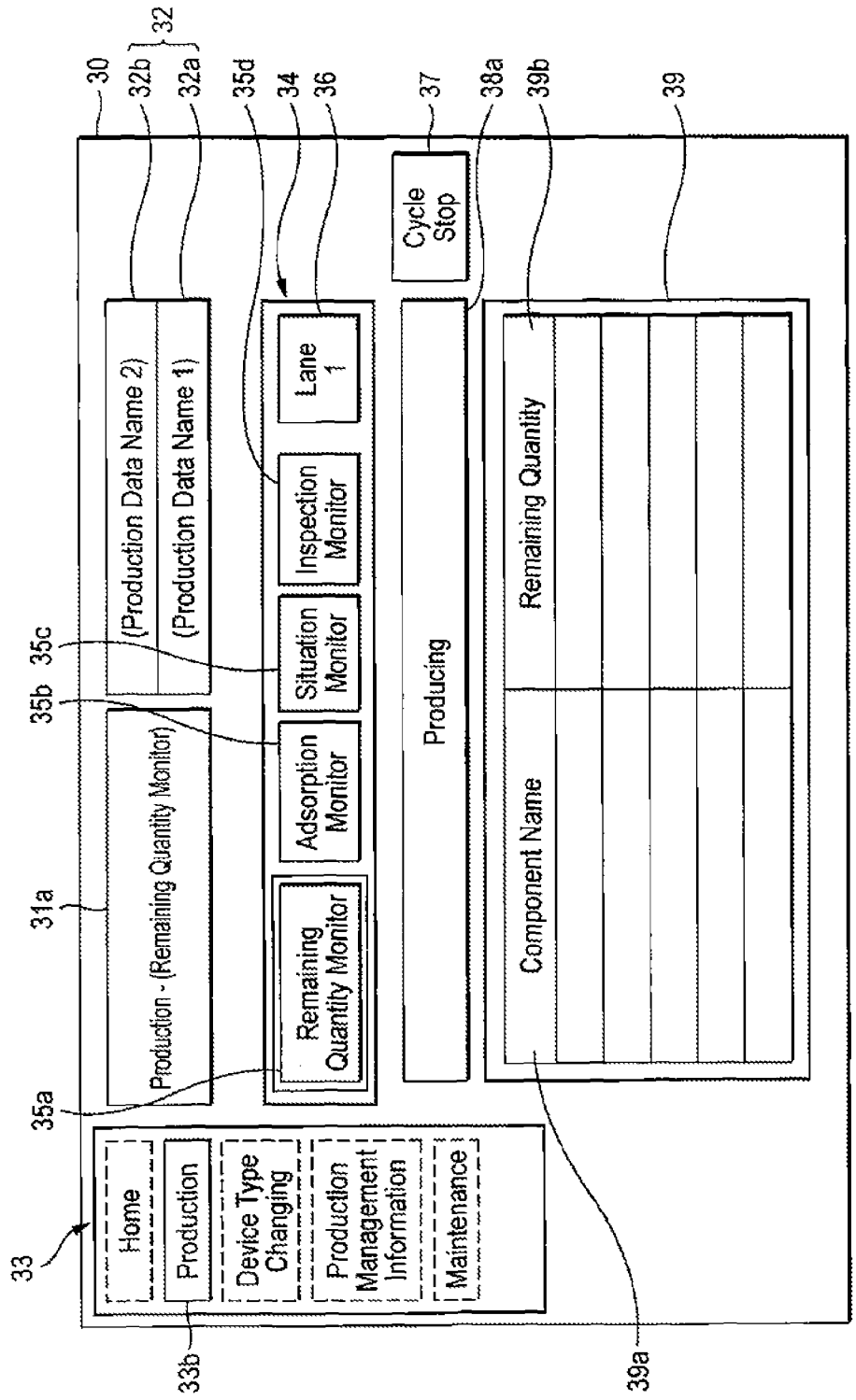
FIG. 5 is an illustrative figure which shows an operation procedure of the operation screen in the component mounting device of the embodiment of the present invention.

Next, the operation subject matters and operation procedures performed on the operation screen 30 when a device type changing operation is performed in a specified mounting lane during the continuous production of the component mounting devices M1 to M3 which form the component mounting system 1 are described with reference to FIGS. 5 to 7. FIG. 5 shows a display example of the operation screen 30 when an automatic production is performed on substrate types specified by the "production data name 1" 32a and the "production data name 2" 32b, respectively, in the first mounting lane L1 and the second mounting lane L2.

That is, the "production" 33b in the first operation switch frame 33 is selected. In response to the selected subject matter, a "remaining quantity monitor" 35a, an "adsorption monitor" 35b, a "situation monitor" 35c and an "inspection monitor" 35d are displayed as the function switches 35 in the second operation switch frame 34, while a "producing" 38a which indicates that the production is performing is displayed in the message frame 38. The "remaining quantity monitor" 35a, the "adsorption monitor" 35b, the "situation monitor" 35c and the "inspection monitor" 35d are operation switches for referring to information on items including remaining component quantity of each of the component supply parts, parameter settings such as nozzle type or adsorption vacuum degree in the component adsorption of the mounting heads, operation situation of the device and inspection that is performed by the device, respectively. In the example shown in FIG. 5, the "remaining quantity monitor" 35a is selected, and thus a "production—remaining quantity monitor" 31a is displayed in response to the selected subject matter in the screen name 31, and a remaining component list, in which component names 39a correspond to remaining quantities 39b respectively, is displayed in the information display area 39.

Figure 6:
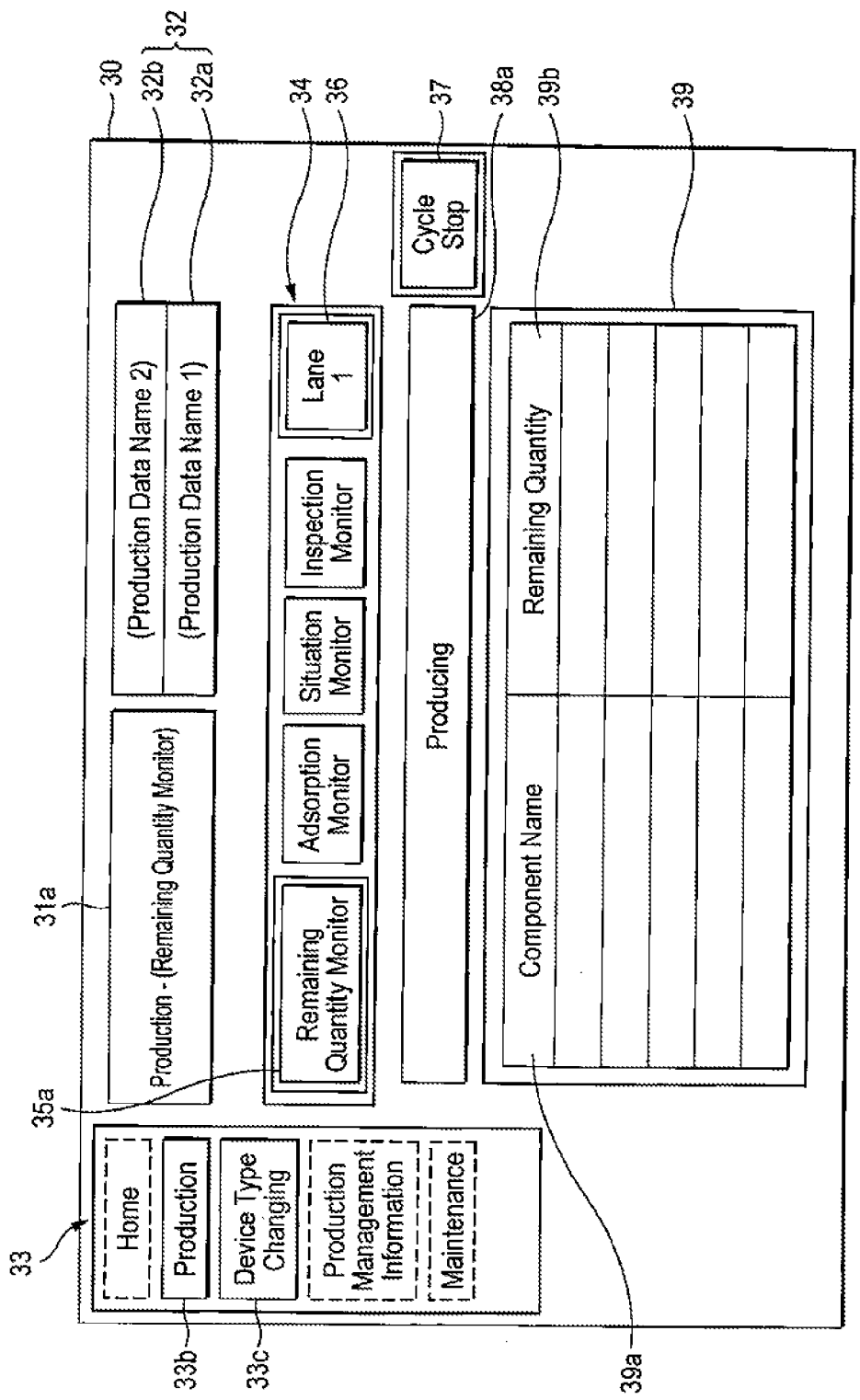
FIG. 6 is an illustrative figure which shows an operation procedure of the operation screen in the component mounting device of the embodiment of the present invention.

Next, FIG. 6 shows a preparation screen for performing a device type changing operation. That is, an operation example is shown in which after a predetermined production quantity is completed in the first mounting lane L1, a device type changing operation is performed for the substrate type of the next production while the automatic production in the second mounting lane L2 is continued. First, the "device type changing" 33c in the first operation switch frame 33 becomes selectable. Then, in the second operation switch frame 34, the lane specifying switch 36 for specifying a mounting lane which is the object of the device type changing is operated to specify the first mounting lane L1, and the stop switch 37 is operated. Thereby, after one cycle of component mounting actions in the first mounting lane L1 is completed, the movable mechanisms of the first mounting lane L1 side of the component mounting devices M1 to M3 are stopped, and the device type changing operation for the first mounting lane L1 becomes performable.

Figure 7:
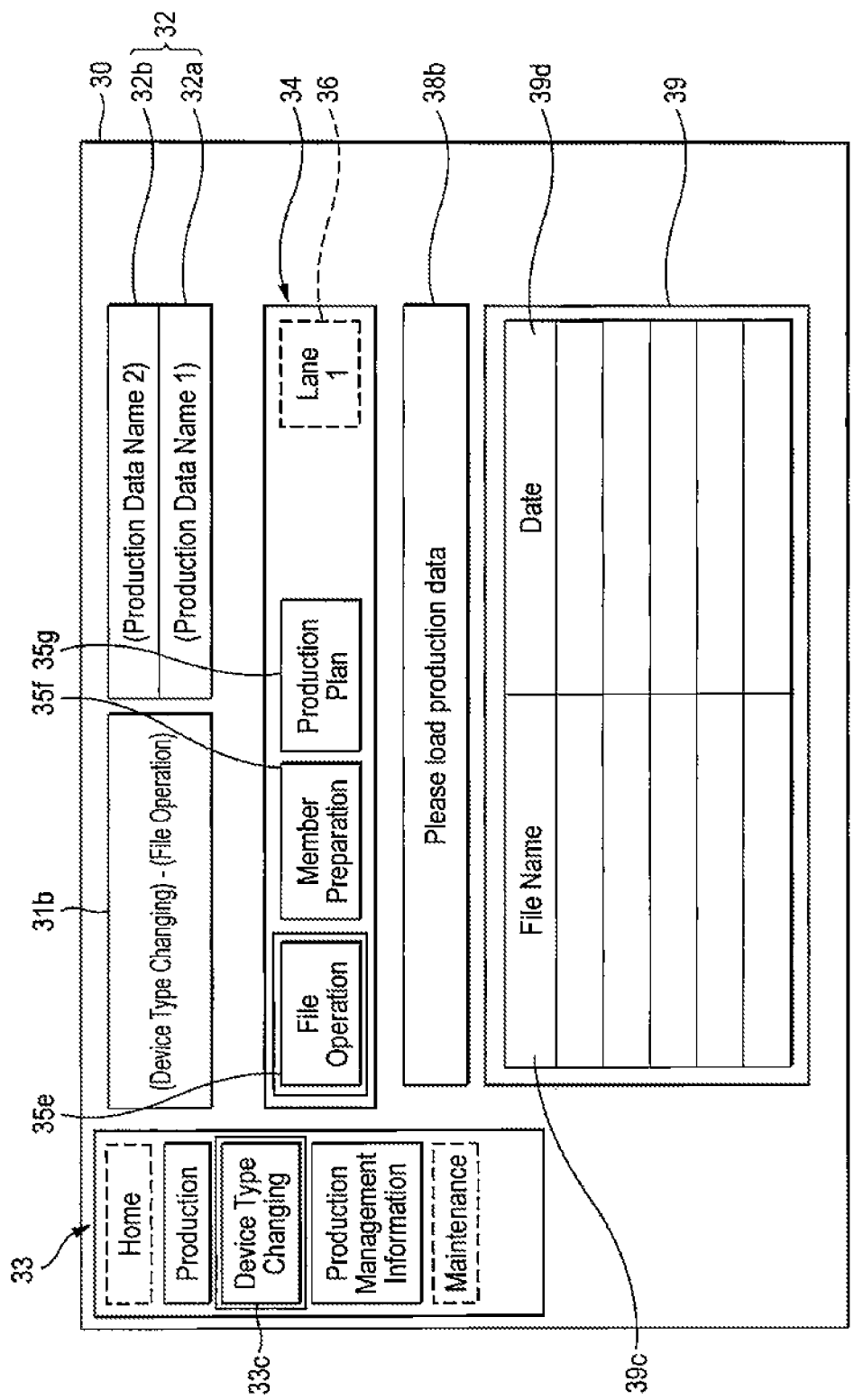
FIG. 7 is an illustrative figure which shows an operation procedure of the operation screen in the component mounting device of the embodiment of the present invention.

Next, as shown in FIG. 7, the "device type changing" 33c in the first operation switch frame 33 is operated. Thereby, a "file operation" 35e, a "member preparation" 35f and a "production plan" 35g, which are operation switches for performing operations associated with the device type changing, are displayed in the second operation switch frame 34, and these operation switches are in an operable condition. Here, an example is shown in which the "file operation" 35e in the second operation switch frame 34 is operated by being selected. Thus, a "device type changing—file operation" 31b is displayed as the screen name 31, and a message "please load production data" 38b for urging to download a file corresponding to the substrate type of the next production is displayed in the message frame 38. A downloading history list, in which file names 39c correspond to dates 39d respectively, is displayed in the information display area 39. By selecting and operating the "member preparation" 35f and the "production plan" 35g sequentially, information such as component information or component production quantity corresponding to the substrate type of the next production can be referred to, and thus the device type changing operation can be performed by the operator.

The above-mentioned input control processes are performed by the input control processing part 24. That is, after the operator specifies an object mounting lane as an operation object with the lane specifying switch 36 and stops the operation actions of the specified object mounting lane by operating the operation panel 4, when the device type changing switch 33c is operated, the input control processing part 24 performs operation processes for the device type changing which make the operation switches (the "file operation" 35e, the "member preparation" 35f and the "production plan" 35g) for performing operations associated with the device type changing for the object mounting lanes to be in an operable state.

Together with these operation processes for the device type changing, the input control processing part 24 refers to the action condition of the second mounting lane L2, and performs processes to prohibit operations with the lane specifying switch 36 when the second mounting lane L2 performs component mounting operations. That is, the operator can not specify the second mounting lane L2 as an operation object by operating the lane specifying switch 36, and the mounting lane which is an operation object is fixed to the first mounting lane L1. At this time, only the operations of the operation switches (the "file operation" 35e, the "member preparation" 35f and the "production plan" 35g) for the first mounting lane L1 are permitted, and the device type changing operation for the first mounting lane L1 is in a performable condition.

Figure 8:
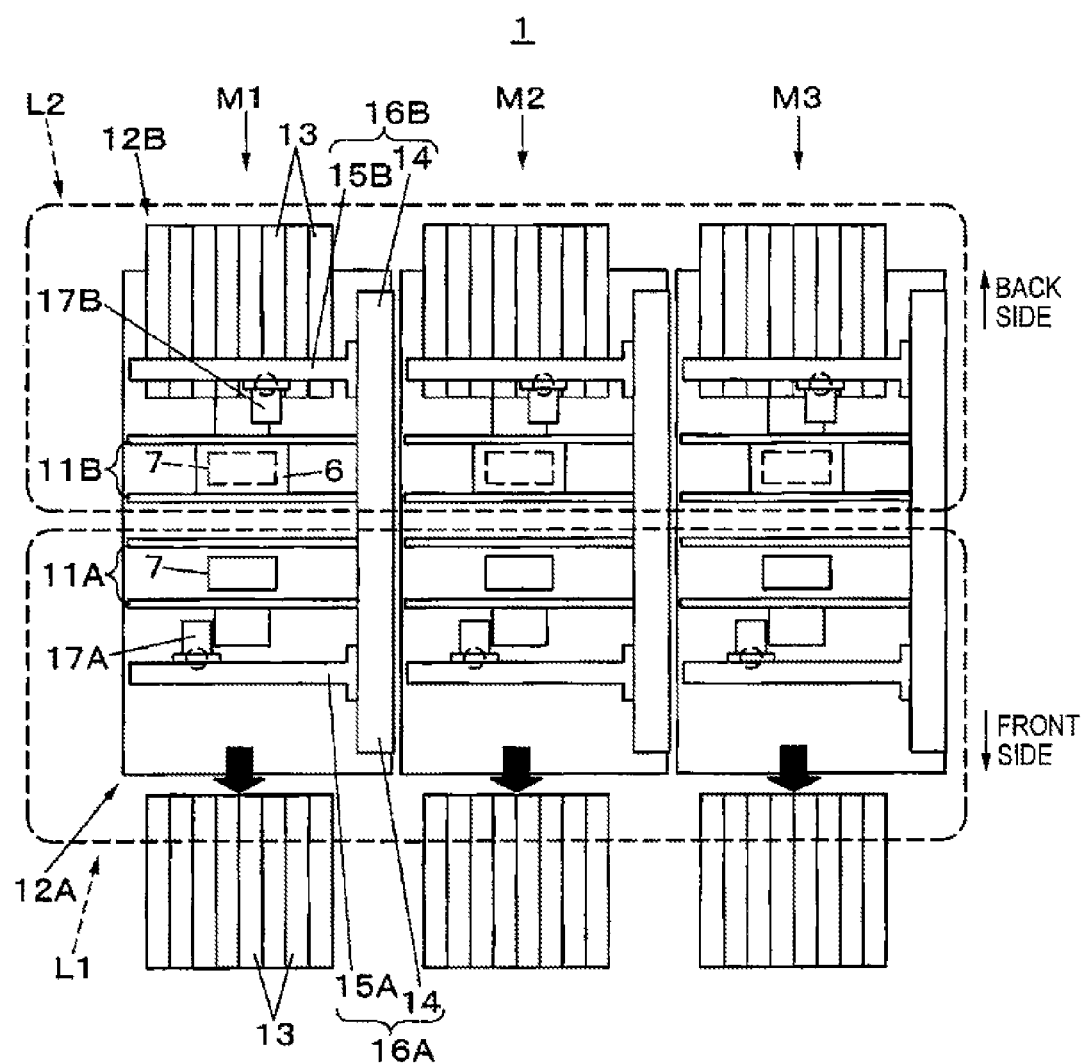
FIG. 8 is a top view of the component mounting system of the embodiment of the present invention.

That is, as shown in FIG. 8, in the component mounting system 1, in the first mounting lane L1 which becomes the object of the device type changing, for all of the component mounting devices M1 to M3, the plurality of tape feeders 13 which were in an installed condition are collectively taken out from the front component supply parts 12A, and an operation of replacing these tape feeders 13 with the tape feeders 13 corresponding to the substrate type of the next production is performed. Further, the adjustment of the conveying width of the front substrate conveying mechanisms 11A or the operation of making the adsorption nozzles installed to the front mounting heads 17A to correspond to the substrate type of the next production is performed as necessary. In the second mounting lane L2, for all of the component mounting devices M1 to M3, the component mounting operations of mounting the components taken out from the tape feeders 13 of the back component supply parts 12B on the substrates 6 which are conveyed by the back substrate conveying mechanisms 11B are continuously performed with the front mounting heads 17A.

At this time, because operations with the lane specifying switch 36 in the operation screen 30 are prohibited, the operations to be performed through the operation screen 30 are limited to those operations for the first mounting lane L1. Thereby, a situation that an input is mistakenly performed on the second mounting lane L2 as an operation object for reasons such as the mistake of an operator will not occur, and it is ensured that the component mounting operations in the second mounting lane L2 whose production is continued are normally performed. That is, the input control processing part 24 performs input control processes to permit the inputting of the operations of the operation switches (the "file operation" 35e, the "member preparation" 35f and the "production plan" 35g) and prohibit the inputting of the operations of the lane specifying switch 36 when the non-object mounting lane except the object mounting lane performs component mounting operations.

Figure 9:
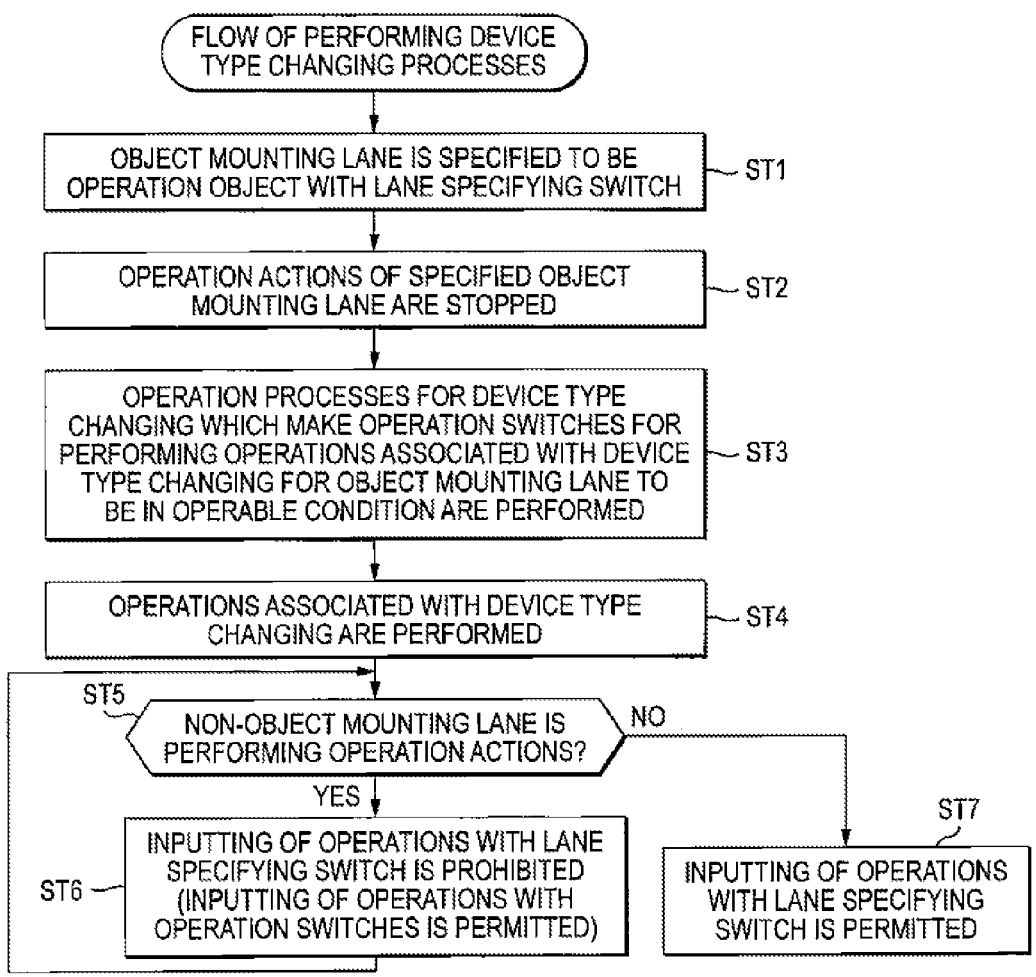
FIG. 9 is a flow chart which shows device type changing processes in the component mounting device of the embodiment of the present invention.

Next, the device type changing processes to change the substrate type for the production object in the component mounting system 1 is described with reference to a flow chart of FIG. 9. Like the previously mentioned example, a process example is shown in which the device type changing operation is performed only for the first mounting lane L1 when the automatic productions of both the first mounting lane L1 and the second mounting lane L2 are continued. First, an operator specifies an object mounting lane to be an operation object with the lane specifying switch 36 by operating the operation panel 4 (mounting lane specifying step), (ST1). That is, as shown in FIG. 6, the first mounting lane L1 is specified as an operation object by operating the lane specifying switch 36.

Then, the operation actions of the specified object mounting lane are stopped (ST2). That is, by operating the stop switch 37, the operation actions of the first mounting lane L1 are stopped. Then, the operation processes for the device type changing which make the operation switches for performing the operations associated with the device type changing for the object mounting lane to be in an operable condition are performed (ST3), (device type changing operation processing step). That is, as shown in FIG. 7, by operating the "device type changing" 33c which is a device type changing switch, the "file operation" 35e, the "member preparation" 35f and the "production plan" 35g corresponding to the "device type changing" 33c are displayed in the second operation switch frame 34, and are in an operable condition.

After that, by operating the "file operation" 35e, the "member preparation" 35f and the "production plan" 35g, the operations associated with the device type changing are performed (ST4), (operation performing step). In this operation performing step, it is recognized by the input control processing part 24 whether the second mounting lane L2 which is a non-object mounting lane is performing operation actions (ST5). Here, if it is YES or if the second mounting lane L2 which is a non-object mounting lanes is performing operation actions, the inputting of the operations with the lane specifying switch 36 is prohibited (ST6). At this time, the inputting of the operations with the "file operation" 35e, the "member preparation" 35f and the "production plan" 35g which are operation switches are permitted, and the performing of the device type changing operation is not impeded. After this, if the production in the second mounting lane L2 is completed and it is recognized that the second mounting lane L2 is not performing operation actions in (ST5), the input control processing part 24 performs processes to permit the inputting of the operations with the lane specifying switch 36. Thereby, the inputting of the operations for performing the device type changing operation for the second mounting lane L2 is newly enabled.

As described above, for the component mounting device and the device type changing method shown in the present embodiment, in the operation performing step that performs operations associated with the device type changing by operating the operation switches, when a non-object mounting lane except the object mounting lane which becomes the operation object performs operation actions, the inputting of operations with the operation switches for performing operations associated with the device type changing is permitted, and the inputting of operations with the lane specifying switch which specifies a mounting lane that becomes an object of the inputting of operations is prohibited. Thereby, the device type changing operation with the change of the substrate type can be easily performed, without stopping the operation of the other mounting lane and without impairing the safety of the operator.

The invention is intended to cover various alterations and applications to made by those who are skilled in the art on the basis of the description of the specification and well-known technology without departing from the spirit and scope of the present invention, and these alterations and applications shall fall within a range where protection of the invention is sought. Without departing from the spirit of the invention, the component elements in the above embodiment may be combined arbitrarily.

This application is based on the Japanese patent application (patent application 2010-281601) filed on Dec. 17, 2010, whose content is incorporated herein by reference.

INDUSTRIAL APPLICABILITY

The component mounting device and the device type changing method in the component mounting device of the invention have an effect that the device type changing operation with the change of the substrate type can be easily performed in the component mounting device which includes a plurality of mounting lanes, without stopping the operation of the other mounting lane and without impairing the safety of the operator, and are useful in the field of manufacturing mounted substrates by mounting components on the wired substrates.

DESCRIPTION OF THE SYMBOLS 1 component mounting system
3 operation substrate
4 operation panel
6 substrate
7 substrate holding part
11A front substrate conveying mechanism (first substrate conveying mechanism)
11B back substrate conveying mechanism (second substrate conveying mechanism)
12A front component supply part (first component supply part)

12B back component supply part (first component supply part)
14 Y axis movable table
15A X axis movable table
15B X axis movable table
16A front head moving mechanism (first head moving mechanism)
16B back head moving mechanism (second head moving mechanism)
17A front mounting head (first mounting head)
17B back mounting head (the second mounting head)
33c "device type changing" (device type changing switch)
36 lane specifying switch
37 stop switch
35e "file operation" (operation switch)
35f "member preparation" (operation switch)
35g "production plan" (operation switch)
L1 first mounting lane
L2 second mounting lane
M1, M2 and M3 component mounting device

The invention claimed is:

1. A component mounting device, comprising:

a first substrate conveying mechanism and a second substrate conveying mechanism which convey substrates delivered from upstream devices in a substrate conveying direction, and have substrate holding parts which position and hold the substrates, respectively;

a first component supply part and a second component supply part which are provided respectively beside the first substrate conveying mechanism and the second substrate conveying mechanism and supply components to be mounted on the substrates;

a first component mounting mechanism and a second component mounting mechanism which take out the components from the first component supply part and the second component supply part which are provided respectively in accordance with the first substrate conveying mechanism and the second substrate conveying mechanism and mount on the substrates which are held by the substrate holding part of the first substrate conveying mechanism and the substrate holding part of the second substrate conveying mechanism, respectively;

an operation panel which makes it possible to input operations for both of a first mounting lane which comprises the first substrate conveying mechanism, the first component supply part and the first component mounting mechanism and a second mounting lane which comprises the second substrate conveying mechanism, the second component supply part and the second component mounting mechanism;

an operation switch which is provided on the operation panel and comprise a lane specifying switch which specifies a mounting lane which is the object of the inputting of operations, a stop switch for stopping the device operations of the specified mounting lane, and a device type changing switch for performing a replacing operation with the change of the substrate type of the substrates as mounting objects; and an input control processing part which controls the inputting of operations performed through the operation switch;

wherein after an operator specifies an object mounting lane as an operation object with the lane specifying switch and stops the operation actions of the specified object mounting lane by operating the operation panel, when the device type changing switch is operated, the input control processing part performs operation processes for the device type changing which make the operation switches for performing operations associated with the device type changing for the object mounting lane to be in an operable state, and when a non-object mounting lane except the object mounting lane performs component mounting operations, the input control processing part performs input control processes to permit the inputting of the operations of the operation switches and prohibit the inputting of the operations of the lane specifying switch.

* * * * *